United States Patent

Kirino et al.

[11] Patent Number: 5,463,600
[45] Date of Patent: Oct. 31, 1995

[54] MAGNETO-OPTICAL RECORDING SYSTEM USING RECORDING WAVEFORM HAVING A PLURALITY OF POWER LEVELS PROVIDING HIGH RECORDING DENSITY

[75] Inventors: Fumiyoshi Kirino, Tokyo; Atsushi Saito, Ichikawa; Tsuyoshi Toda; Hiroshi Ide, both of Kodaira; Hiroyuki Tsuchinaga; Takeshi Maeda, both of Kokubunji; Fumio Kugiya, Hachioji, all of Japan

[73] Assignee: Hitachi, Ltd., Tokyo, Japan

[21] Appl. No.: 225,315

[22] Filed: Apr. 8, 1994

[30] Foreign Application Priority Data

Apr. 15, 1993 [JP] Japan .................. 5-088391

[51] Int. Cl.⁶ ............................................ G11B 13/04
[52] U.S. Cl. ............................................ 369/13; 369/116
[58] Field of Search ................................ 369/13, 14, 116, 369/59, 124, 275.4; 360/59, 114, 40, 41, 42; 365/122

[56] References Cited

U.S. PATENT DOCUMENTS

| | | | |
|---|---|---|---|
| 5,060,208 | 10/1991 | Nagai et al. | 369/13 |
| 5,229,986 | 7/1993 | Mizokami et al. | 369/59 |
| 5,233,589 | 8/1993 | Saito et al. | 369/59 |
| 5,235,590 | 8/1993 | Taguchi et al. | 369/13 |
| 5,311,493 | 5/1994 | Fuji | 369/59 |
| 5,327,417 | 7/1994 | Tanaka et al. | 369/13 |
| 5,329,503 | 7/1994 | Ohmori et al. | 369/13 |
| 5,333,126 | 7/1994 | Fukuda et al. | 369/59 |
| 5,335,216 | 8/1994 | Suzuki et al. | 369/59 |
| 5,345,434 | 9/1994 | Ide et al. | 369/59 |
| 5,361,248 | 11/1994 | Hatwar et al. | 369/13 |

FOREIGN PATENT DOCUMENTS

| | | |
|---|---|---|
| 59-178641 | 10/1984 | Japan . |
| 3-22223 | 1/1991 | Japan . |

*Primary Examiner*—Scott J. Sugarman
*Assistant Examiner*—Tan Dinh
*Attorney, Agent, or Firm*—Antonelli, Terry, Stout & Kraus

[57] ABSTRACT

A magneto-optical disk system includes a magneto-optical disk and a disk drive. The magneto-optical disk drives provides a function of controlling the shape of a recorded domain by using a short wavelength laser beam and a test recording and a function of recording a using a pulse train. The magneto-optical disk has a laminated layer structure capable of obtaining a high S/N ratio and stabilizing a heat conduction. The magneto-optical disk drive with the recorded domain shape control function using a short wavelength laser beam and a test recording and with the pulse train recording record function is organically coupled with the magneto-optical disk having the laminated layer structure with a stabilized heat conduction to make the disk and the disk drive have an integrity therebetween, providing a magneto-optical disk having a recording capacity four times as large as the first generation magneto-optical disk system.

26 Claims, 5 Drawing Sheets

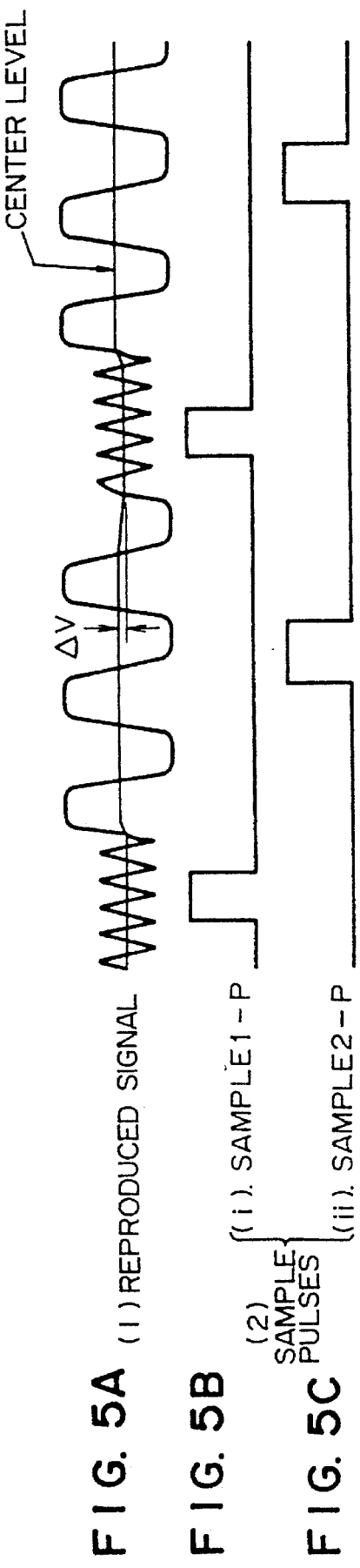

3000 rpm
r = 30 mm

LEADING EDGE TO
LEADING EDGE 14.6 ns 40 ns

TRAILING EDGE TO
TRAILING EDGE 16.6 ns 40 ns

MAGNETO-OPTICAL RECORDING SYSTEM USING RECORDING WAVEFORM HAVING A PLURALITY OF POWER LEVELS PROVIDING HIGH RECORDING DENSITY

BACKGROUND OF THE INVENTION

The present invention relates to magneto-optical data recording, reproducing, and erasing, by using a laser beam, and more particularly to a magneto-optical disk and a magneto-optical disk drive suitable for increasing a recording capacity.

Rewritable magneto-optical recording has been used for recording data of text and graphics files, and its performance, particularly a recording density has been improved by various approaches such as (1) using a laser beam having a short wavelength in data recording and reproducing, (2) shortening a track pitch and a bit pitch, (3) using a ZCAV scheme, and (4) using a mark edge recording scheme.

For example, JP-A-59-178641 discloses a technique of improving an optical data reproducing performance by using an improved recording medium without deteriorating a data recording performance. JP-A-3-22223 discloses a technique of forming a better bit shape by controlling a pulse train of a recording bit write signal to compensate for an influence of heat generated by a preceding bit write. These conventional techniques pertain only to a recording method, particularly to a method of controlling a recorded domain shape and a method of recording data at a high density, and are not fully sufficient for providing a function of a magneto-optical disk system which can record data at an ultra high density.

SUMMARY OF THE INVENTION

In order to realize a high density recording for a magneto-optical disk and a disk drive by fully demonstrating their performances, it is important to provide a high integrity between the disk and drive, to prevent a structure relaxation of an amorphous recording film to be caused by a high energy concentration even if a laser beam having a shorter wavelength is used, to provide a sufficient control precision necessary for a desired recordings density, and so on. It is therefore required that respective technical parameters of a disk drive and a disk are related to each other organically.

It is therefore an object of the present invention to provide a magneto-optical disk and a magneto-optical disk drive, capable of recording data at a recording density four or more times as high as that of a first generation magneto-optical disk drive.

Still further advantages of the present invention will become apparent to those of ordinary skill in the art upon reading and understanding the following detained description of the preferred and alternate embodiments.

To achieve the above object, the invention provides a magneto-optical disk drive for recording, reproducing, and erasing data by using a laser beam, including apparatus for rotating a magneto-optical disk at a predetermined rotation speed;

apparatus for modulating code data to be recorded, in accordance with a predetermined modulation scheme; and apparatus for recording an ellipsoidal recorded domain on the magneto-optical disk, the opposite ends of the ellipsoidal recorded domain corresponding to "1" of the modulated code data, and the bit length of the ellipsoidal recorded domain in the radial direction of the magneto-optical disk being maintained generally constant.

A magneto-optical disk of the invention has a diameter of 5.25 inches, a predetermined format, a usable recording capacity of at least 1.3 GB on one side of the disk, and an effective data transport speed of at least 2 MB/sec.

To achieve the above object, in a magneto-optical disk drive for recording, reproducing, and erasing data by using a laser beam, code data to be recorded is modulated in accordance with a predetermined modulation scheme, and while rotating a magneto-optical disk at a predetermined rotation speed, an ellipsoidal recorded domain is recorded on the magneto-optical disk, the opposite ends of the ellipsoidal recorded domain corresponding to "1" of the modulated code data, and the bit length of the ellipsoidal recorded domain in the radial direction of the magneto-optical disk being maintained generally constant. In modulating code information to be recorded in accordance with a predetermined modulation scheme and in recording an ellipsoidal recorded domain on the magneto-optical disk, the opposite ends of the ellipsoidal mark corresponding to "1" of the modulated code data, a pitch between modulated shortest marks is set equal to or larger than a pitch of code data marks to be recorded.

Each side of a magneto-optical disk has four layers including a transparent substrate having a guide groove and pre-pits and a diameter of 5.25 inches, a first inorganic compound dielectric layer, a magneto-optical recording layer having a vertical magnetic anisotropy, a second inorganic compound dielectric layer, and a light reflecting layer, respectively laminated in this order from the bottom. Two sets of the laminated four layers are adhered together with the substrates having outward and protective resin is coated thereon to complete a single magneto-optical disk. A laser beam used for recording, reproducing, and erasing data has a wavelength shorter than 700 nm, preferably a wavelength near 680 nm. By optimizing the disk structure, particularly by controlling a thermal conductivity of a metal layer, it is possible to obtain a magneto-optical disk sufficiently resistant against an energy density concentration to be caused by a laser beam having a shorter wavelength. A so-called independent leading/trailing edge reproducing method is used for reproducing recorded data. With this method, the front and back edges of a recorded domain in the disk circumferential direction are detected independently, and the detected data is discriminated and thereafter synthesized and decoded. It is preferable to use recording data by using a pulse train having a plurality of power levels. The pulse width is preferably set so as to be synchronized with a write clock. A write laser beam has at least four power levels. The first level is a lowest power level for use in reproducing data. The second level is a preheat level for use in controlling the temperature of the recording layer of the disk to be constant so as to be independent of an operating environmental temperature and a write data pattern. The third and fourth levels are recording levels. It is preferable to control the highest temperature of the recording layer by properly setting the third and fourth levels, to thereby effectively maintain a domain width constant and control the domain length at a high precision. Only the third recording level is used to form a record domain corresponding to the shortest pattern determined by a modulation scheme and to control the shape of the recorded domain with a modulated recording waveform. The four levels each have a specific function in forming a modulated recording waveform. The four levels are used for controlling the heat conduction in the disk. The specific function of the second level is to heat the recording layer of the disk and maintain it to have a predetermined temperature. This second power level is therefore changed in accordance with an operating environmental temperature. The specific function of the third level is to recording the shortest pattern. The specific function of the fourth level is to record a domain having a constant width by balancing the fourth level with the third level while considering the thermal conduction in the disk. Immediately after pulses are recorded, the first level is applied for a predetermined time period, and thereafter the second level is applied. It is preferable that ratios between the laser power levels are set in a predetermined range, and more preferably, a ratio of the third level to the second level is larger than 1.5 and smaller than 2.0, a ratio of the fourth level to the second level is larger than 1.5 and smaller than 2.0, and a ratio of the third level to the fourth level is larger than 0.85 and smaller than 1.0. From the viewpoint of simplicity of manufacturing a disk drive, the width of each recording pulse and the pitch between pulses are preferably set to be synchronized with an integer multiple or divisor of a write clock. Before data is recorded on a magneto-optical disk, a preheat level is applied for a predetermined time period, preferably a time period corresponding to a length of 0.2 μm of the disk track or longer. This time period changes with a disk rotation speed and a laminated layer structure of a disk.

A laser power is changed to control a recorded domain. A pulse width of a laser beam is changed to control a recorded domain more precisely. Before data is recorded, a predetermined test pattern formed by pulses is recorded on a disk in a predetermined test area. In accordance with the results of the test, the recording conditions are determined so that a shape of each recorded domain can be controlled precisely. A test pattern has a repetition of a plurality of shortest and longest patterns determined by a modulation scheme. In view of future high density recording, a signal modulation scheme is preferably a (1, 7) RLL modulation scheme. A test pattern is recorded using standard laser powers or pulse widths, and using laser powers or pulse widths obtained by changing the standard laser powers or pulse widths by predetermined amounts, to thereby search for optimum recording conditions. A recorded domain shape changes with an operating environmental temperature, a laser power, a sensitivity variation at each area of a disk, a sensitivity variation among disks, and the like. This change can be suppressed by slicing a signal waveform reproduced from a recorded test pattern at preset levels to binarize it and by controlling a difference of a signal amplitude center value between the binarized shortest patterns and longest patterns determined by a modulation scheme so as to make the difference zero. A test pattern is recorded at least at the time of disk loading and at a time of disk drive set-up, or at a constant time interval after the disk drive starts running. The recording or erasing conditions are determined from the results of the reproduced test pattern. In determining optimum recording conditions from the results of a test, it is preferable that ratios between the laser power levels are set in a predetermined range, and more preferably, a ratio of the third level to the second level is larger than 1.5 and smaller than 2.0, a ratio of the fourth level to the second level is larger than 1.5 and smaller than 2.0, and a ratio of the third level to the fourth level is larger than 0.85 and smaller than 1.0. It is preferable to control a recorded domain shape by changing the laser power set to the above ratio, or by changing the laser pulse width with a constant laser power.

An optical head has a lens numerical aperture (NA) at least larger than 0.55 and can radiate a laser beam having at least one wavelength to a disk. A disk has a track pitch of 1.16 μm or less and a bit pitch of 0.48 μm or less, and uses a (1, 7) RLL modulation scheme as a modulation scheme. A 5.25-inch disk has at least 33 sectors and 270336 bits or more per track at a diameter of 30 mm, and at least 66 sectors and 540672 bits or more per track at a diameter of 60 mm. The disk is rotated at 3000 rpm or faster when recording, reproducing, and erasing data. In a recording/reproducing system of a magneto-optical disk, it is preferable to perform a waveform equalizing process in reproducing data to thereby suppress an edge shift generated by aberration of an optical system of an optical head. It is also preferable to perform a waveform equalizing process in reproducing data to thereby suppress an edge shift generated by a disk/head inclination. A waveform equalizer is provided in a reproducing circuit because a slope of the rising edge (front edge) or falling edge (back edge) of a reproduced waveform changes with aberration of an optical system of an optical head and a disk/head inclination and the same data is reproduced having a different edge shift amount. If an automatic equalizer circuit is used, it can deal with a disk inclination, thereby improving a reproduction control precision. Aberration of an optical system and a head inclination are specific to a disk drive. Therefore, equalizing parameters of a disk drive can be adjusted when it is shipped from the factory. An automatic equalizing circuit is used for improving a control precision. A domain width is controlled to be always 0.65 μm or narrower independently from environments, disk drives, and disks. It is necessary that the control precision is better than ±0.05 μm in the domain width direction (disk radial direction) and ±0.02 μm in the disk circumference direction.

As described above, an ultra high density optical recording can be realized by a combination of a laser beam having a wavelength equal to or shorter than 700 nm, a test pattern recording, recording using a pulse train and preheating, a mark edge recording, a waveform equalizer circuit, and an independent front/back edge detection method. Accordingly, it is possible to provide a 5.25-inch magneto-optical disk system having a recording capacity of 1.3 GB on one side of a disk which is four times as large as a presently available disk.

BRIEF DESCRIPTION OF THE DRAWINGS

The invention will be described in conjunction with certain drawings which are for the purpose of illustrating the preferred and alternate embodiments of the invention only, and not for the purposes of limiting the same, and wherein:

FIGS. 5A to 5D show a reproduced signal waveform, sample pulse waveforms, and a graph showing measured potential differences at various recording powers;

DESCRIPTION OF THE PREFERRED EMBODIMENTS

The details of the invention will be described with reference to the preferred embodiments.

Figure 1:
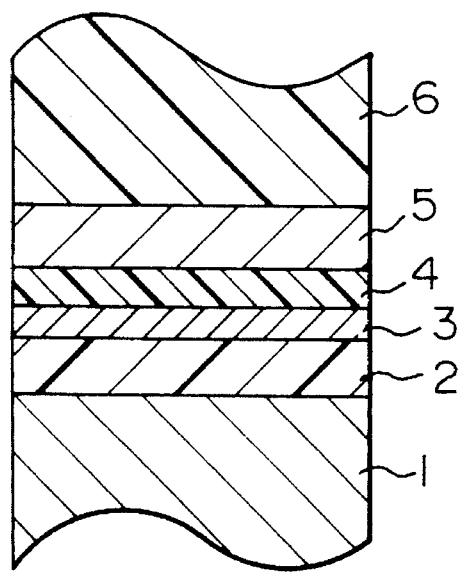
FIG. 1 is a schematic cross sectional view showing the structure of a magneto-optical disk.

FIG. 1 is a schematic cross sectional diagram showing the structure of a magneto-optical disk according to an embodiment. On a glass or plastic substrate 1 having a guide groove with pre-pits, a silicon nitride film 2 formed by sputtering to a thickness of 65 nm. Next, a TbFeCoNb film 3 formed by sputtering to a thickness of 25 nm. A silicon nitride film 4 formed by sputtering to a thickness of 15 nm. Lastly, an $Al_{95}Ti_5$ film 5 formed by sputtering to a thickness of 50 nm. This structure is not limitative, but other structures with optical interference which can provide a large magneto-optical Kerr rotation angle may also be used. The disk is covered with ultraviolet ray thermosetting resin 6.

Figure 3:
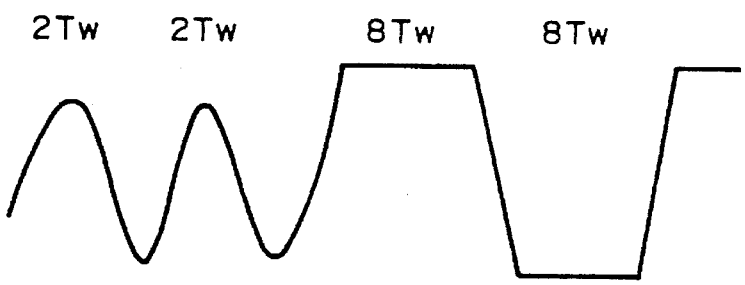
FIG. 3 shows a test pattern for a test recording.
Figure 4:
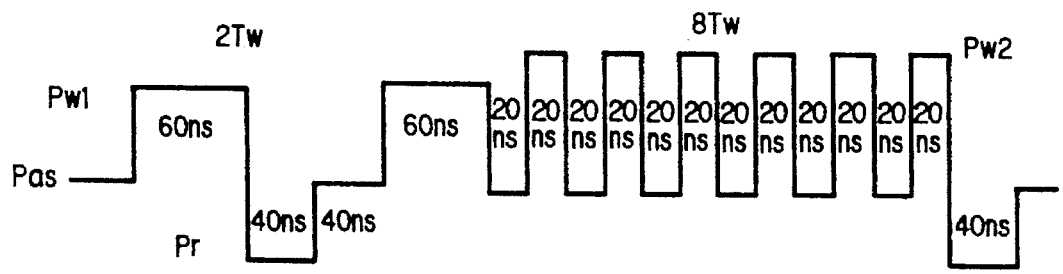
FIG. 4 shows a pulse train for recording a test pattern.
Figure 2:
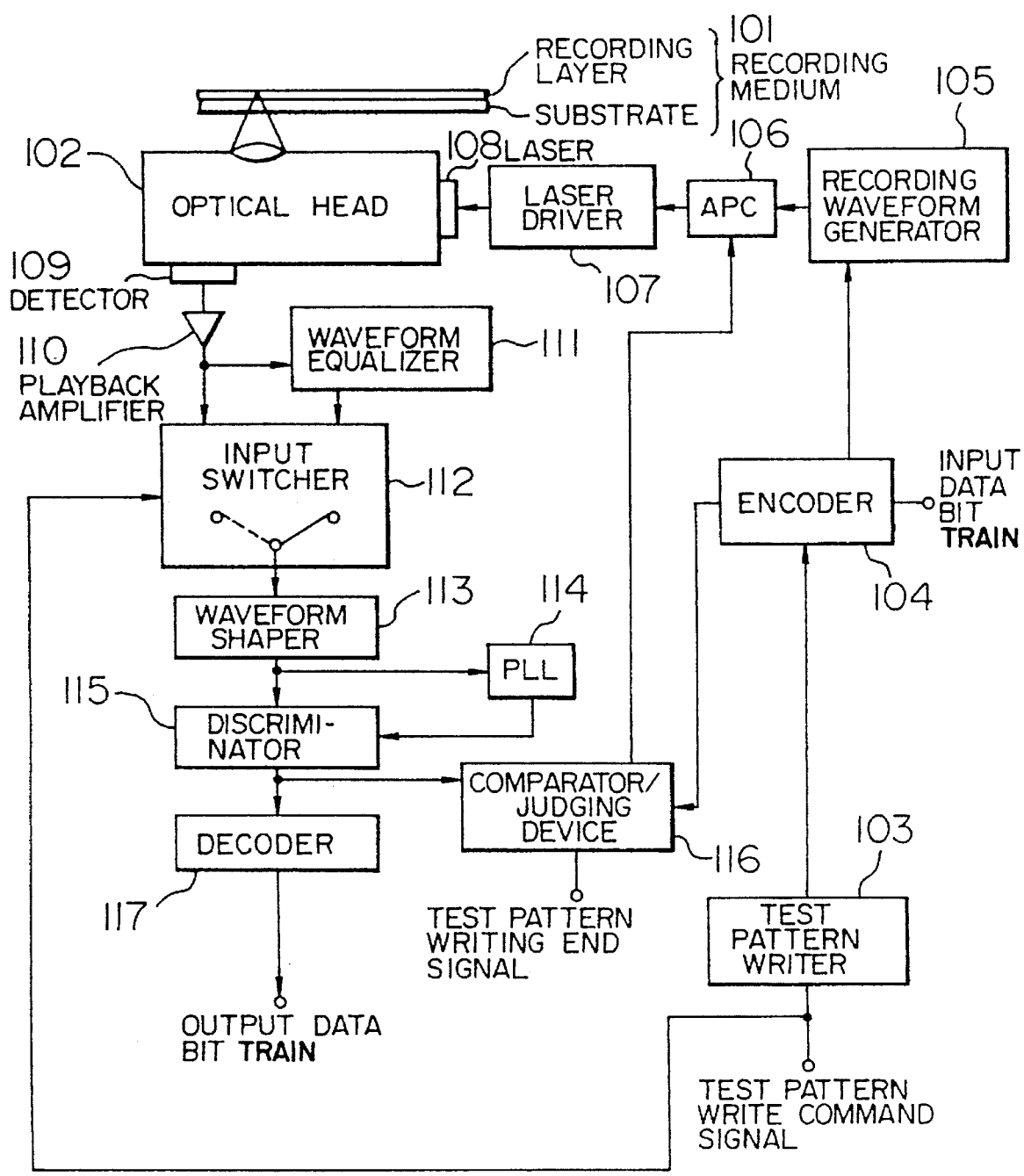
FIG. 2 is a block diagram showing the structure of a magneto-optical disk drive.

A block diagram showing the structure of a magneto-optical disk drive is shown in FIG. 2. A characteristic feature of this drive is a test recording function. Test recording is performed at the time of disk loading, at a time of disk drive set-up, or at a constant time interval after the disk drive starts running. A test pattern for a test recording is shown in FIG. 3. This pattern includes shortest patterns (2 Tw) and longest patterns (8Tw) determined by a (1, 7) RLL modulation scheme. A pulse train for recording the test pattern is shown in FIG. 4. A reproducing power Pr is 1.5 mW, a preheat power Pas is 3.5 mW, the first recording power Pw1 is 5.53 mW, and the second recording power Pw2 is 5.71 mW. These values are determined depending upon the disk laminated layer structure, the disk materials, and the recording layer magnetic characteristics. The width of each pulse of the pulse train is given in FIG. 4. FIG. 5A shows a signal waveform reproduced from a test recording at certain power levels. As seen from FIG. 5A, there is a difference of a signal amplitude center value between the shortest patterns (2 Tw) and longest patterns (8 Tw). Recording conditions which make this difference zero are determined by performing test recording. Test patterns may be recorded in each of a plurality of sectors by changing recording conditions, or in a single sector by changing recording conditions. Test patterns are recorded at the standard power levels preset in the disk drive and by changing the standard levels by ±3% and ±6%. The signal amplitude center values at the shortest patterns (2 Tw) and the longest patterns 8 Tw) are detected using the sample pulse waveforms shown in FIGS. 5B and 5C. Optimum conditions which make a difference of a signal amplitude center value between shortest patterns (2 Tw) and longest patterns (8 Tw) become are determined as shown in FIG. 5D. Although the optimum recording conditions are determined by changing the laser power levels, the width of each pulse of the pulse train may be changed in order to improve a recording control precision. A test pattern recording zone has two tracks per each zone. For example, the outermost circumference track and innermost circumference track in each zone or two tracks at the central area of each zone may be used. A test pattern may be recorded in each zone, or it may be recorded in typical zones of a 5.25-inch disk such as the innermost circumference zone (r=30 mm), the middle circumference zone (r=45 mm), and the outermost circumference zone (r=60 mm) and the recording conditions for the other zone of the disk may be calculated on the assumption that the characteristics of the other zones change linearly from the typical zones or change in accordance with a predetermined rule. Test recording is performed at the time of disk loading, at a time of disk drive set-up, and at an interval of 5 minutes after the disk drive starts running.

The structure and operation of the magneto-optical disk drive shown in FIG. 2 will be described. The wavelength of the laser beam used for recording data is 680 nm. A recording/reproducing apparatus has a recording medium 101 for recording data, an optical head 102 for recording and reproducing data, and a processing system for obtaining original data from a signal reproduced by the optical head 102. The optical head 102 focuses a beam radiated from a laser 108 onto the recording medium 101. In a data recording operation, an input a data bit train is inputted to an encoder 104 which outputs a recording code train to a recording waveform generator 105. A recording waveform outputted from the recording waveform generator 105 is inputted to an APC 106, and a laser beam having an intensity corresponding to the recording code train is emitted from the laser 108. In a data reproduction operation, a laser beam reflected from the recording medium 101 is guided by the optical head 102 to a detector 109 and converted into an electric signal. This signal is inputted to a playback amplifier 110 whose output is supplied to a waveform equalizer 111 and an input switcher 112. In response to a test pattern write command signal, the input switcher 112 selects either an output of the playback amplifier 110 or an output of the waveform equalizer 111. A signal selected by the input switcher 112 is supplied to a waveform shaper 113 which converts the reproduced signal into a pulse signal. This pulse signal is supplied to a discriminator 115 and a PLL 114. A synchronizing signal (synchronized with a fundamental frequency of the pulse signal) outputted from PLL 114 is supplied to the discriminator 115 which generates a reproduced code train from the pulse signal and synchronizing signal. The detected code train is decoded by a decoder 117 which outputs an output data bit train. The reproduced code train outputted from the discriminator 115 is supplied to a comparator/judging device 116. In response to the test pattern write command signal, a test pattern writer 103 outputs a test pattern which is supplied to the encoder 104 and the input switcher 112 selects an output of the playback amplifier 110. Under these conditions, the comparator/judging device 116 compares the recording code train outputted from the encoder 104 with the reproduced code train outputted from the discriminator 115. When a difference between the recording code train and the reproduced code train becomes small within an allowable range, a test pattern writing end signal is outputted. After this signal is outputted, the input switcher 112 selects an output from the waveform equalizer 111 and supplies it to the waveform shaper 113 to start an ordinary recording operation. Even after the start of the ordinary recording operation, the comparator/judging device 116 checks whether a difference between the recording code train and the reproduced code train remains in the allowable range. If not, the test pattern writing operation is again performed and the normal recording operation resumes after the test pattern writing end signal is outputted. When the comparator/judging device 116 checks a difference between the recording code train and the reproduced code train, the input switcher 112 selects an output of the playback amplifier 110 because this difference can be detected more precisely by using the output of the playback amplifier 110. The above operations can be performed by replacing the input switcher by a different circuit configuration. It is preferable not to use the waveform equalizer 111 in order for the comparator/judging device 116 to precisely detect a difference between the recording code train and the reproduced code train.

Figure 6A:
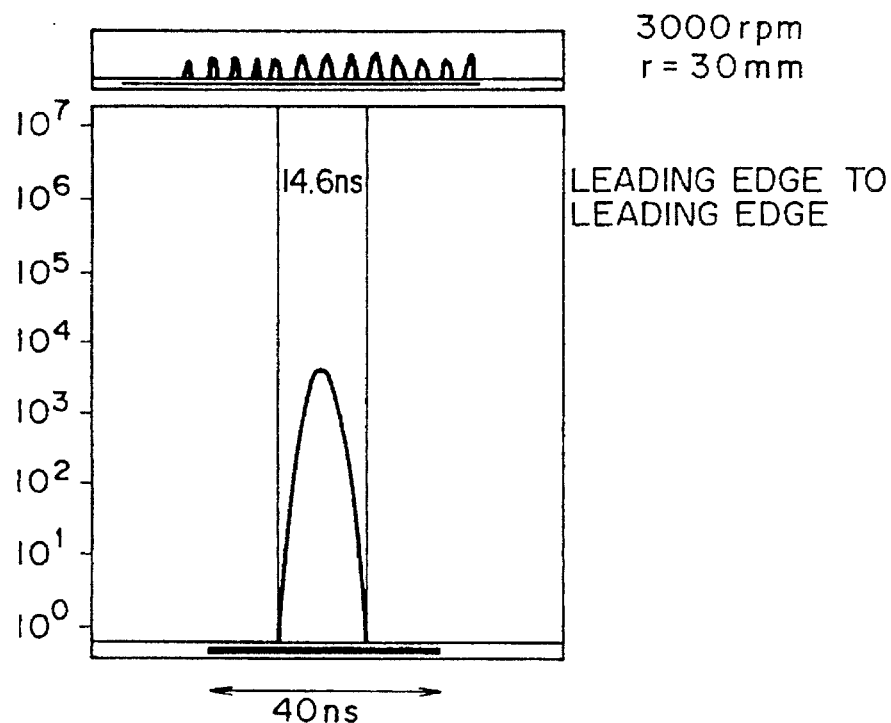
FIGS. 6A and 6B show a jitter distribution obtained when recording a random pattern.
Figure 6B:
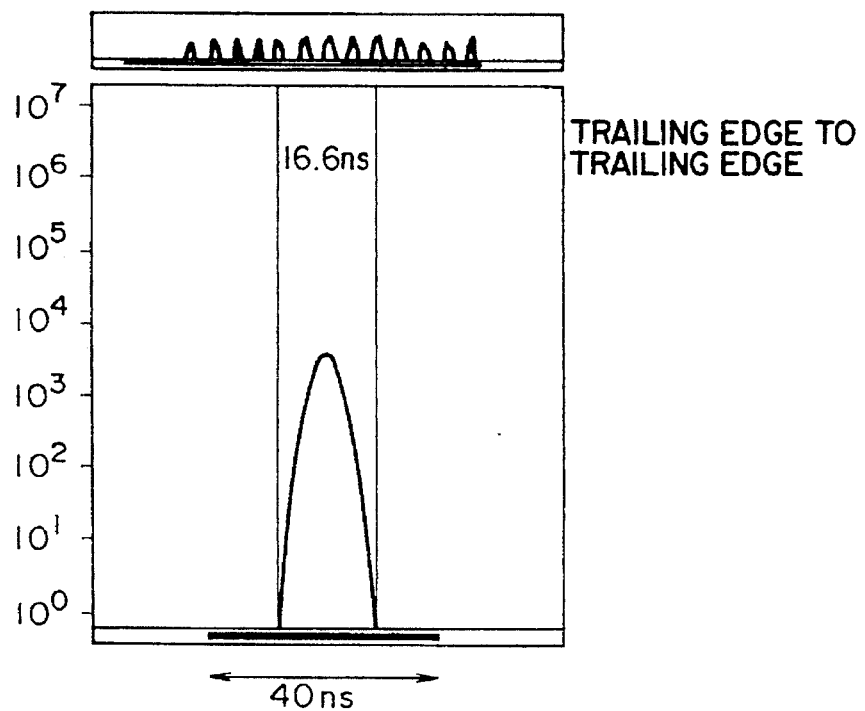
Figure 7:
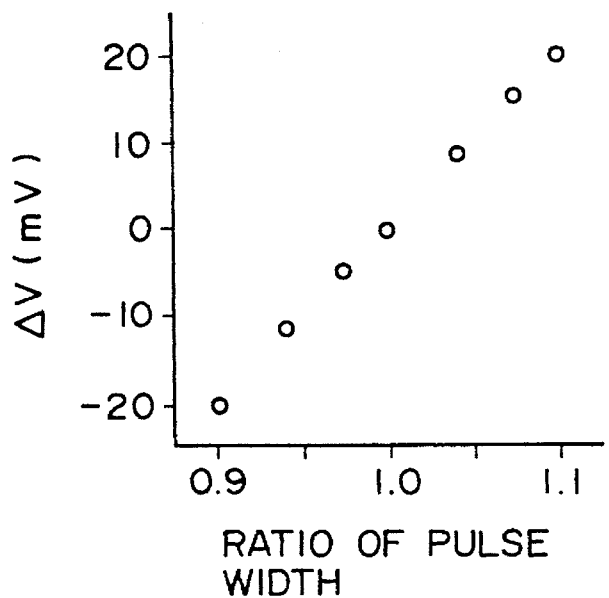
FIG. 7 is a graph showing potential differences (ΔV) between shortest patterns and longest patterns at a room temperature of 20° C.
Figure 8:
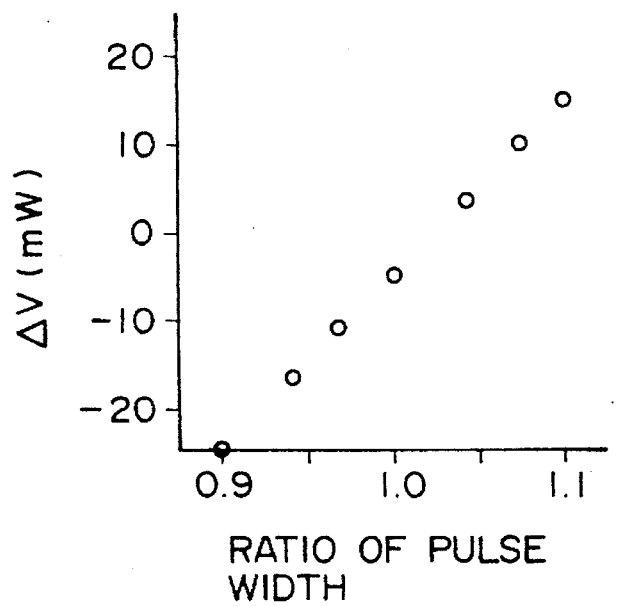
FIG. 8 is a graph showing potential differences (ΔV) between shortest patterns and longest patterns at 0° C.

Data was recorded and reproduced by using the above-described recording/reproducing apparatus and the recording medium. The disk was rotated at a rotation speed of 3000 rpm, the wavelength of the laser beam was 680 nm, and the (1, 7) RLL modulation scheme was used as a modulation scheme. Data was recorded at the same recording density regardless of the position on the disk. The test pattern shown in FIG. 4 was used. The read level Pr was set to 1.5 mW, the preheat level Pas was set to 3.5 mW, the first recording level Pw1 was set to 5.8 mW, and the second recording level Pw2 was set to 6.1 mW. Each power level depends upon the disk laminated layer structure and disk materials. Of these, the disk laminated layer structure is most effective for suppressing jitters and edge shifts to be caused by thermal interference between recorded domains to a certain level or less. In this context, an evaluation of parameters on the recording/reproducing apparatus side requires that ratios of Pw1/Pas, Pw2/Pas, and Pw1/Pw2 are in a predetermined range. These ratios were measured by using a number of disks. For disks having ratios in the range of 1.5<Pw1/Pas<1.7, 1.6<Pw2<1.8, and 0.9<Pw1/Pw2<1.1, the length and width of a recorded domain in mark edge recording could be precisely, controlled. The control precision was better than ±0.05 μm in the domain width direction (disk radial direction) and ±0.02 μm in the domain length direction (disk circumference direction). This control precision was obtained by measuring reproduced jitters and edge shifts and by measuring with an MFM (magnetic force scanning microscope). Data was recorded and reproduced at the innermost circumference zone of a 5.25-inch disk. First a random pattern was recorded at a room temperature of 20° C., at the standard power levels, and using the (1, 7) RLL modulation scheme. The jitter distribution is shown in FIGS. 6A and 6B which was measured without a PLL. The ratio of a jitter to a window width was 39%. The measured edge shift was suppressed to less than ±2 ns. The recording/reproducing apparatus and recording medium were placed in an environment at a temperature of 50° C. Under these conditions, the ratio of a jitter to a window width increased to 50%. The shift increased greatly to ±10 ns. Using the apparatus and medium, test patterns having a repetition of patterns of 2 Tw and 8 Tw were recorded by changing the pulse widths by ±3%, ±6%, and ±10%. Changes of the signal amplitude center value between the longest and shortest patterns were measured. The results of detected potential differences (ΔV) between patterns are shown in FIG. 7. The pulse width with ΔV=0 was obtained from this graph. The pulse width was narrower by 5% than the room temperature condition. The pulse width was reduced by 5% and test patterns were recorded. A ratio of a jitter to a window width was 39%, and a measured edge shift amount was suppressed to ±2 ns or less which are the same as the above-described case using the standard power levels and standard environment (room temperature). The recording/reproducing apparatus and recording medium were placed in the environment at a temperature of 0° C. Data was recorded without a test recording at the standard power levels. The results were an increase of a ratio of a jitter to a window width to 65% and an increase of a shift amount to ±15 ns. Thereafter, test patterns having a repetition of patterns of 2 Tw and 8 Tw were recorded by changing the pulse widths by ±3%, ±6%, and ±10%. Changes of the signal amplitude center value between the longest and shortest patterns were measured. The results of detected potential differences (ΔV) between patterns are shown in FIG. 8. The pulse width with ΔV=0 was obtained from this graph. The pulse width was wider by 7% than the room temperature condition. The pulse width was increased by 7% and random test patterns which a user may possibly use were recorded. A ratio of a jitter to a window width was 39%, and a measured edge shift amount was suppressed to ±2 ns or less which are the same as the above-described case using the standard power levels and standard environment (room temperature).

The format of a magneto-optical disk used in this embodiment conforms with a ZCAV scheme and the recording capacity per track is as follows. The disk has a track pitch of 1.16 μm or less and a bit pitch of 0.48 μm or less, and uses the (1, 7) RLL modulation scheme as a modulation scheme. A 5.25-inch disk has at least 33 sectors and 270336 bits or more per track at a diameter of 30 mm, and at least 66 sectors and 540672 bits or more per track at a diameter of 60 mm. The disk is rotated at 3000 rpm or faster when recording, reproducing, and erasing data to ensure the above-described recording capacity.

According to the present invention, the magneto-optical disk drive with a recorded domain shape control function using a short wavelength laser beam and a test recording and with a pulse train recording function is organically coupled with the magneto-optical disk having the laminated layer structure with a stabilized heat conduction to make the disk and the drive have an integrity therebetween. It is possible to provide a magneto-optical disk having a recording capacity four times as large as the first generation magneto-optical disk system.

The invention has been described with reference to the preferred and alternate embodiments. Obviously, modifications and alterations will occur to those of ordinary skill in the art upon reading and understanding the present invention. It is intended that the invention be construed as including all such modifications and alterations in so far they come within the scope of the appended claims or the equivalent thereof.

What is claimed is:

1. A magneto-optical disk drive for recording, reproducing, and erasing data by using a laser beam, comprising:

means for rotating a magneto-optical disk at a predetermined rotation speed;

means for modulating code information to be recorded, in accordance with a predetermined modulation scheme; and means for recording an ellipsoidal recorded domain on said magneto-optical disk, the opposite ends of said ellipsoidal recorded domain corresponding to "1" of said modulated code information, and the bit length of said ellipsoidal recorded domain in the radial direction of said magneto-optical disk being maintained generally constant;

wherein said magneto-optical disk has two laminated layers each including
a transparent substrate having a guide groove and pre-pits and a diameter of 5.25 inches;
a first inorganic compound dielectric layer;
a magneto-optical recording layer having a vertical magnetic anisotropy, and
a second inorganic compound dielectric layer, and a light reflecting layer,
wherein said two laminated layers are adhered together with each said substrate facing outward and protective resin is coated thereon to complete said magneto-optical disk;

wherein a waveform of said laser beam used for recording and reproducing code information has a plurality of power levels;

wherein said power levels include:

a first level for use in reproducing code information;

a second level for use in controlling the temperature of said recording layer of said magneto-optical disk constant so as to be independent from an operating environmental temperature and a write code data pattern; and third and fourth levels in combination for use in controlling a maximum temperature of said recording layer during code information recording; and wherein said first to fourth levels are set to such values so as to maintain a domain width constant and control the domain length at a high precision.

2. A magneto-optical disk drive according to claim 1, wherein said magneto-optical disk has a diameter of 5.25 inches, a predetermined format, a user recording capacity of at least 1.3 GB on one side of said disk, and an effective data transport speed of at least 2 MB/sec.

3. A magneto-optical disk drive according to claim 1, wherein a pitch between modulated shortest marks is set equal to or larger than a pitch of code information marks to be recorded.

4. A magneto-optical disk drive according to claim 1, wherein the wavelength of said laser beam is shorter than 700 nm.

5. A magneto-optical disk drive according to claim 1, wherein said modulated code information recorded in correspondence with the opposite ends of said recording domain is demodulated by independently detecting the leading and trailing edges of said recorded domain in the disk rotation direction, by discriminating said detected data, and by synthesizing said detected data.

6. A magneto-optical disk drive according to claim 1, wherein said code information is recorded by modulating a waveform of said laser beam to have a waveform constituted by a plurality of pulses having a plurality of power levels.

7. A magneto-optical disk drive according to claim 1, wherein said recorded domain corresponding to the shortest pattern is formed by using said third level.

8. A magneto-optical disk drive according to claim 1, wherein a ratio of said third level to said second level is larger than 1.5 and smaller than 2.0, a ratio of said fourth level to said second level is larger than 1.5 and smaller than 2.0, and a ratio of said third level to said fourth level is larger than 0.85 and smaller than 1.0.

9. A magneto-optical disk drive according to claim 1, wherein said modulated code information is recorded by said laser beam modulated so as to have a waveform constituted by a plurality of pulses, the width of each said pulse and the pitch between said pulses being set to synchronize with an integer multiplication or division of a write clock.

10. A magneto-optical disk drive according to claim 8, wherein before said modulated code information is recorded, recording conditions are determined by recording a predetermined test pattern on said magneto-optical disk at a predetermined test area by using said laser beam.

11. A magneto-optical disk drive according to claim 10, wherein said test pattern is a pattern having a repetition of a plurality of shortest and longest patterns alternately disposed and determined by a modulation scheme.

12. A magneto-optical disk drive according to claim 11, wherein said test pattern is recorded at standard laser powers or at standard pulse widths, and at laser powers or pulse widths obtained by changing said standard laser powers or pulse widths.

13. A magneto-optical disk drive according to claim 1, further comprising:

means for slicing a signal waveform reproduced from a recorded test pattern at preset levels to binarize said signal waveform; and means for controlling a difference of a center value between binarized shortest patterns and longest patterns to become zero, to thereby suppress a change in the recorded domain shape with an operating environmental temperature, a laser power, a sensitivity variation at each area of said disk, and a sensitivity variation among said disks.

14. A magneto-optical disk drive according to claim 10, wherein said test pattern is recorded at the time of disk loading, at a time of disk drive set-up, or after a disk drive starts running, respectively at a constant time interval, and said recorded test pattern is reproduced to determine recording or erasing conditions.

15. A magneto-optical disk drive according to claim 1, wherein an optical head of the magneto-optical disk drive has a lens numerical aperture (NA) at least larger than 0.55 and radiates said laser beam having at least one wavelength to said magneto-optical disk.

16. A magneto-optical disk drive according to claim 1, wherein said magneto-optical disk drive has a disk size of 5.25 inches, a track pitch of not greater than 1.16 µm, and a bit pitch of not greater than 0.48 µm.

17. A magneto-optical disk drive according to claim 1, wherein said magneto-optical disk having a disk size of 5.25 inches has at least 33 sectors and at least 270336 bits per track at a diameter of 30 mm, and at least 66 sectors and at least 540672 bits per track at a diameter of 60 mm.

18. A magneto-optical disk drive according to claim 1, wherein said magneto-optical disk having a disk size of 5.25 inches is rotated at at least 3000 rpm when recording, reproducing, and erasing code data.

19. A magneto-optical disk drive according to claim 15, wherein a recording/reproducing system of the magneto-optical disk drive performs a waveform equalizing process in reproducing code data to suppress an edge shift generated by aberration of an optical system of said optical head.

20. A magneto-optical disk drive according to claim 15, wherein a waveform equalizing process is performed in reproducing code data to suppress an edge shift generated by a relative inclination between said magneto-optical disk and said optical head.

21. A magneto-optical disk drive according to claim 10, wherein after said test pattern is recorded, said laser beam having said second level is applied to said magneto-optical disk for a time period corresponding to a length of at least 0.2 µm of the track direction.

22. A magneto-optical disk drive according to claim 8, wherein said laser powers or pulse widths are controlled by maintaining said laser power ratios constant.

23. A magneto-optical disk drive according to claim 10, wherein the width of said recorded domain recorded after said test pattern is recorded is controlled to become not greater than 0.65 µm.

24. A magneto-optical disk drive according to 10, wherein the control precision of said recorded domain recorded after said test pattern is recorded is set better than ±0.05 µm in the domain width direction (disk radial direction) and ±0.02 µm in the disk circumference direction.

25. A magneto-optical disk drive according to claim 1, wherein the opposite ends of said recorded domain are detected to reproduce "1" of said modulated code data.

26. A magneto-optical disk drive according to claim 1, wherein said code information to be recorded is modulated by a (1, 7) RLL modulation scheme.

* * * * *